United States Patent
Jedeloo

(10) Patent No.: US 7,885,614 B2
(45) Date of Patent: Feb. 8, 2011

(54) ANTENNA SWITCH WITH ADAPTIVE FILTER

(75) Inventor: Pieter Willem Jedeloo, Nijmegen (NL)

(73) Assignee: NXP B.V., Eindhoven (NL)

( * ) Notice: Subject to any disclaimer, the term of this patent is extended or adjusted under 35 U.S.C. 154(b) by 330 days.

(21) Appl. No.: 10/565,150

(22) PCT Filed: Jul. 12, 2004

(86) PCT No.: PCT/IB2004/051192
§ 371 (c)(1),
(2), (4) Date: Jan. 19, 2006

(87) PCT Pub. No.: WO2005/008908
PCT Pub. Date: Jan. 27, 2005

(65) Prior Publication Data
US 2006/0232358 A1     Oct. 19, 2006

(30) Foreign Application Priority Data
Jul. 22, 2003    (EP) .................. 03102255

(51) Int. Cl.
*H04B 1/44*    (2006.01)
(52) U.S. Cl. .............. 455/83; 455/84; 455/180.1; 333/100; 333/101
(58) Field of Classification Search ............ 455/78, 455/82, 83, 84, 550.1, 552.1, 553.1, 180.1; 333/100, 101
See application file for complete search history.

(56) References Cited

U.S. PATENT DOCUMENTS

| 6,765,536 | B2 * | 7/2004 | Phillips et al. ............... 343/702 |
| 6,795,714 | B1 * | 9/2004 | Fickenscher et al. ...... 455/552.1 |
| 6,847,829 | B2 * | 1/2005 | Tanaka et al. ............ 455/552.1 |
| 7,005,940 | B2 * | 2/2006 | Kodim ....................... 333/101 |
| 7,295,814 | B2 * | 11/2007 | Yamashita et al. ............ 455/83 |
| 7,343,137 | B2 * | 3/2008 | Block et al. ................... 455/78 |
| 2002/0086644 | A1 * | 7/2002 | Koskinen ..................... 455/88 |
| 2003/0008693 | A1 * | 1/2003 | Tanaka et al. ............... 455/575 |
| 2004/0266378 | A1 * | 12/2004 | Fukamachi et al. ...... 455/188.1 |

FOREIGN PATENT DOCUMENTS

EP     1237222 A1     9/2002

OTHER PUBLICATIONS

M/A-Com, Inc. Advance Information 2V Control Triple-Band GSM/DCS SP5T Switch 0.5-2.0GHz. pp. 1-5.

* cited by examiner

*Primary Examiner*—Lana N Le
*Assistant Examiner*—Ping Y Hsieh

(57) ABSTRACT

An antenna switch (31) that is arranged to alternately operate in a receive mode and a transmit mode, comprises adaptive filter (30). Herewith, signal processing means (Rx1, Rx2 and Rx3) can be coupled to an antenna (1) during the receive mode and be insulated from the antenna during the transmit mode.

14 Claims, 3 Drawing Sheets

ANTENNA SWITCH WITH ADAPTIVE FILTER

The invention relates to an antenna switch which is being arranged to alternately operate in a receive mode and in a transmit mode. The invention further relates to a module and a portable radio device comprising such an antenna switch.

The present invention can be used in wireless telecommunication applications that are arranged to alternately transmit or receive wireless signals such as, mobile phones, personal digital assistants or wireless interfaces for (portable) computers. The invention is particularly suited to multiband wireless telecommunication applications that are arranged to receive radio frequency signals from or transmit radio frequency signals in different frequency bands such as the GSM/DCS, PCS or EDGE frequency bands. Antenna switches are generally known in the art such as SW444 from M/A-com or CSH 510 from Infineon Technologies. These prior art antenna switches use GaAs high-power pHEMT switching devices for coupling transmitters and receivers to the antenna.

It is an object of the present invention to provide an improved antenna switch for use in wireless telecommunication equipment. To this end, the antenna switch that is arranged to alternately operate in a receive mode and a transmit mode, comprises an adaptive filter for coupling signal processing means to an antenna during the receive mode and for electrically insulating the signal processing means from the antenna during the transmit mode.

The invention is based upon the insight a transmitter that is coupled to the antenna may impose high voltages upon that antenna during the transmit mode that may be fed back to and consequently damage the signal processing means. By providing an adaptive filter that is arranged to electrically insulate the processing means, e.g. a receiver, from the antenna during the transmit mode, damage to the processing means can easily be prevented without a need for high-power and expensive switching devices that would otherwise be required for decoupling the processing means from the antenna.

In an embodiment of an antenna switch according to the present invention, the signal processing means are electrically insulated from the antenna by controllably configuring the adaptive filter such that the adaptive filter is coupled between the antenna and ground during the transmit mode. Herewith, the entire voltage that is imposed on the antenna during the transmit mode is applied to the adaptive filter only, which means that harmful voltages are not fed back to the processing means.

In an embodiment of an antenna switch according to the present invention, the adaptive filter is a high-impedance filter during the transmit mode and a low-impedance filter during the receive mode. According to the present invention, the entire voltage that is imposed on the antenna during the transmit mode is applied to the adaptive filter. By making the adaptive filter a high-impedance filter, the current and associated power that must be absorbed by the filter can be considerably reduced, whereas, during reception, the received signals should be attenuated as little as possible, which requires that the adaptive filter should be a low impedance filter.

In another embodiment of an antenna switch according to the present invention, the adaptive filter has a first passband during the transmit mode and a second passband during the receive mode. With this, it is possible to arrange the antenna switch so that it can only receive radio frequency signals from, or transmit radio frequency signals in certain preferred frequency bands such as the GSM/DCS or EDGE frequency bands. Signals that lie outside these preferred frequency bands are suppressed or rejected. Additionally, this embodiment provides the advantage that the filter also suppresses or rejects the higher harmonics of the received or transmitted radio frequency signals, which otherwise may cause interference.

In an embodiment of an antenna switch according to the present invention, the adaptive filter comprises a switch device through which the processing means is coupled to adaptive filter. Herewith, the receiver can galvanically be coupled or decoupled from the antenna.

In an embodiment of an antenna switch according to the present invention, the switch device is a low-power switch device. They are generally more compact and less expensive switching devices.

In another embodiment of an antenna switch according to the present invention, the adaptive filter further provides electrostatic discharge protection. This has the advantage that no additional ESD protection devices have to be integrated into either the antenna switch itself or into the signal processing means for protection against an electrostatic discharge.

In an embodiment of an antenna switch according to the present invention, the adaptive filter comprises switching devices for changing the geometry of the filter. Herewith, the characteristics of the filter can easily be adapted depending on the operational mode of the antenna switch.

Embodiments of a module and a mobile radio device according to the present invention, correspond with embodiments of the antenna switch according to the present invention.

These and other aspects of the invention will be apparent from and elucidated with reference to the embodiments described hereinafter.

Figure 1:
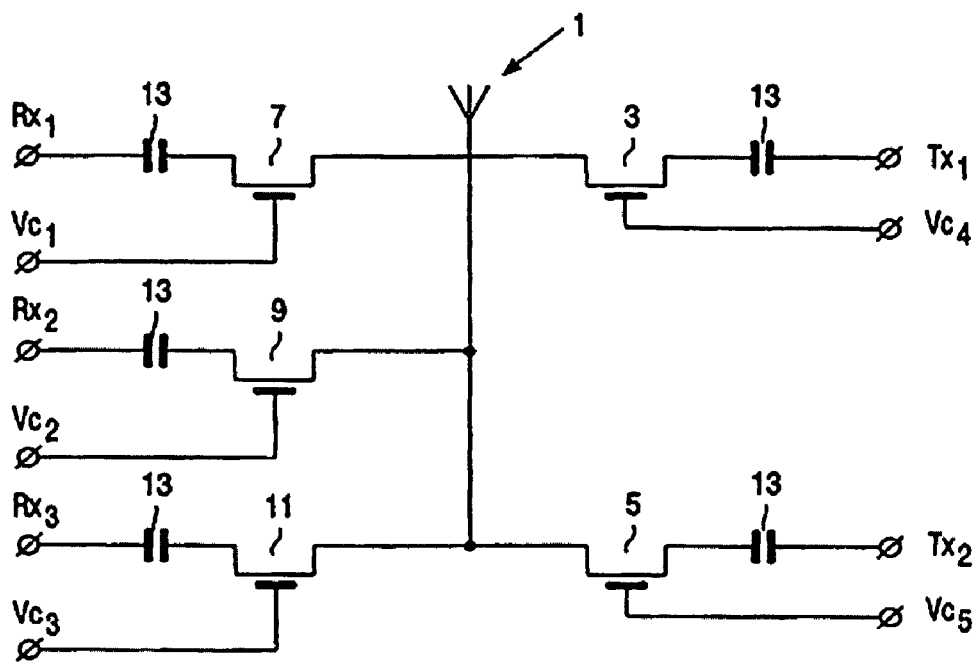
FIG. 1 shows a functional model of a prior art antenna switch.

In FIG. 1, a functional model of an antenna switch according to the prior art is provided. The antenna switch comprises switching devices 7,9 and 11 for coupling multiple receivers (not shown here) to the antenna 1. Each receiver may be arranged to process radio frequency signals (not shown here) that originate from different frequency bands such as GSM/DCS, PCS or EDGE. The antenna switch further comprises switching devices 3 and 5 for coupling multiple transmitters to the antenna 1 for transmitting radio frequency signals in the different frequency bands. The switching devices are controlled by applying a control voltage (Vc1, Vc2, Vc3, Vc4, Vc5) to the gate of the switching devices.

Figure 2:
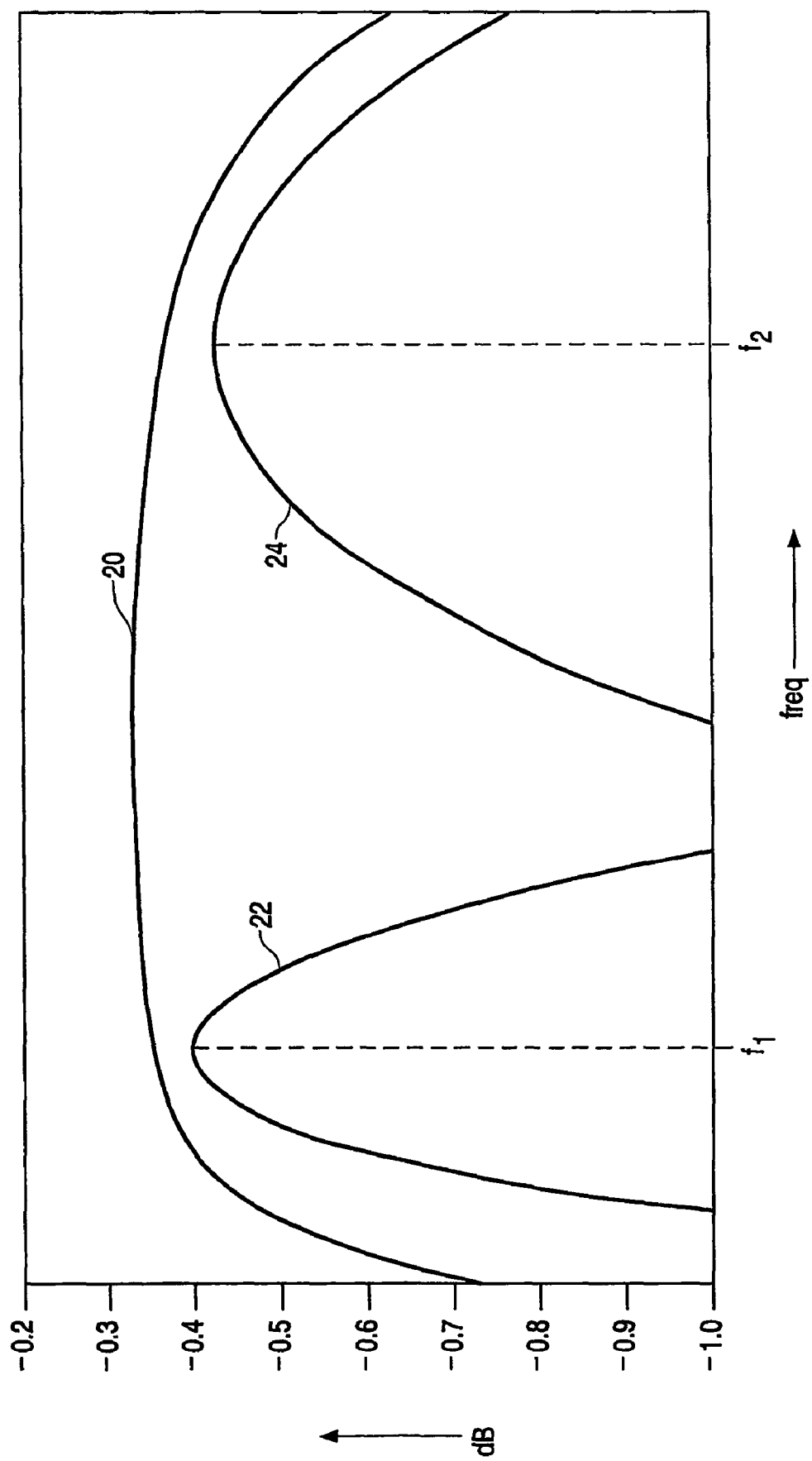
FIG. 2 shows an example of the filter characteristics of the adaptable filter according to the present invention.

FIG. 2 shows by means of example, a possible filter characteristic of the adaptive filter. According to the present invention, the filter characteristics of the adaptive filter are determined by the operational mode of the antenna switch i.e. the transmit mode and receive mode. In addition, through the antenna switch multiple transmitters and or receivers can be coupled to and decoupled from the antenna. This is reflected in the design of the adaptive filter. The adaptive filter of FIG. 2 for example, is designed to operate as a high-pass filter (curve 20) during the receive mode and to operate as a band-pass filter (curves 22,24) during the transmit mode. The adaptive filter of FIG. 2 is designed to support two transmitters for the transmission of radio frequency signals in two frequency bands. Curve 22 can be used for a transmitter that transmits radio frequency signals in the GSM frequency band while curve 24 can be used for a transmitter that transmits radio frequency signals in the DCS frequency band.

Figure 3:
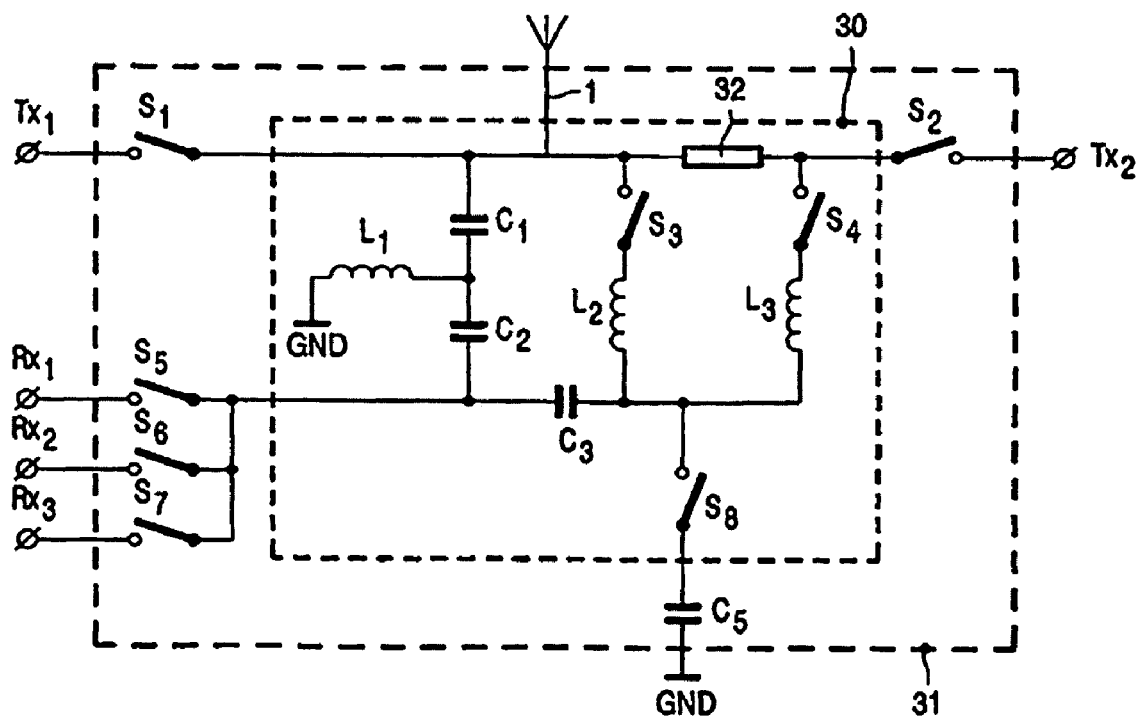
FIG. 3 shows an embodiment of an antenna switch according to the present invention.

FIG. 3 shows an antenna switch according to the present invention comprising adaptable filter 30. The adaptive filter 30 is equipped with switches S3,S4 and S8 to modify the geometry of the filter in accordance with the operational mode of the antenna switch 31. The antenna switch 31 according to FIG. 3 supports two transmitters Tx1 and Tx2 and three receivers Rx1,Rx2 and Rx3 for the transmission and reception respectively of radio-frequency signals. It will be apparent to the man skilled in the art that antenna switches 30 can support an arbitrary number of transmitters and receivers.

The transmitters Tx1 and Tx2 can be coupled to the antenna through switches S1 and S2 which are alternately operated i.e. only one of the transmitters at a time Tx1 and Tx2 is coupled to the antenna 1. The receivers Rx1,Rx2 and Rx3 are coupled to the antenna 1 through the adaptable filter. Although most of the time only one receiver at a time will be coupled to the antenna 1, it is also possible to simultaneously couple multiple receivers Rx1,Rx2 and Rx3 to the antenna 1 for a parallel reception of multiple radio frequency signals that originate from different frequency bands.

The adaptable filter 30 comprises switches S3, S4 and S8 to change the geometry of the filter depending on the operational mode of the antenna switch. During the receive mode, switches S1, S2, S3, S4 and S8 are opened so that the adaptive filter comprises L1, C1 and C2 which represents a high-pass filter. During the transmit mode, the geometry of the adaptive filter 30 changes to a band-pass filter. In case Tx1 is coupled to the antenna, switches S1,S3 and S8 are closed so that the adaptive filter 30 comprises C1,C2,C3, L1 and L2. In case Tx2 is coupled to the antenna 1 the adaptive filter 30 comprises C1,C2 C3, L1 and L3. By having different values for L1 and L3 it is possible to obtain different band-pass filter characteristics as is for example illustrated by curves 22 and 24 of FIG. 2. By closing S8 during transmission, Rx1,Rx2 and Rx3 are coupled to ground through decoupling capacitor C3. Herewith, receivers Rx1, Rx2 and Rx3 are shielded from harmful voltages that may be imposed onto the antenna by any one of the transmitters Tx1 and Tx2. According to the present invention, the adaptive filter is a high impedance filter during the transmit mode which considerably reduces the flow of current through the adaptive filter. Inductor L1 also serves as an ESD protection device.

Various components can be used as switching devices for example high-power pHEMT switches, low-power pHEMT switches, CMOS RF switches or even MEMS (MicroElectromechanical Machine Systems) switches. In a cost effective implementation of the antenna switch S1, S2, S3 and S4 and S8 could be implemented as PIN diodes while S5,S6 and S7 could be low-power pHEMT switches. It will be apparent to the man skilled in the art that in this case a decoupling device 32 is required to prevent that the PIN diodes S3 and S4 are galvanically coupled. Decoupling device 32 could be implemented as a capacitor.

Figure 4:
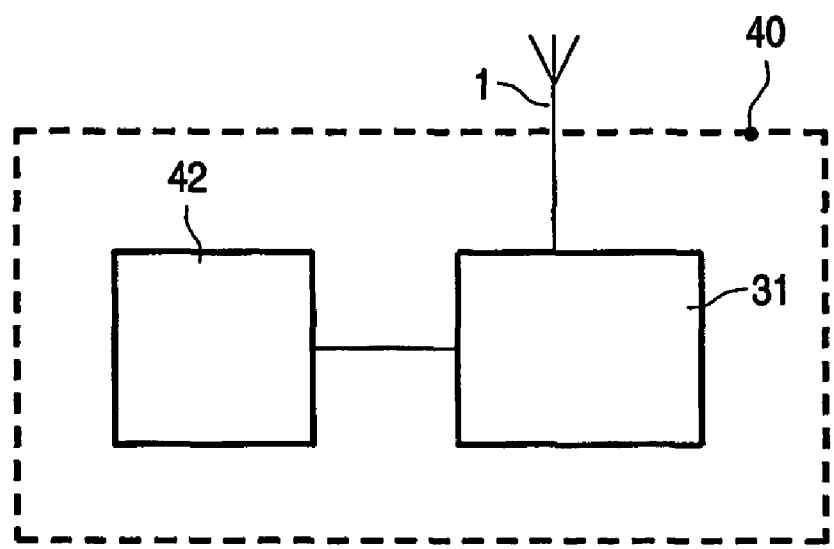
FIG. 4 shows a module comprising an antenna switch according to the present invention.

FIG. 4 shows a module 40 that comprises an antenna switch 31 that is coupled to a radio frequency front end 42. The radio frequency front end 42 is arranged to generate or process the transmitted or received radio frequency signals.

Figure 5:
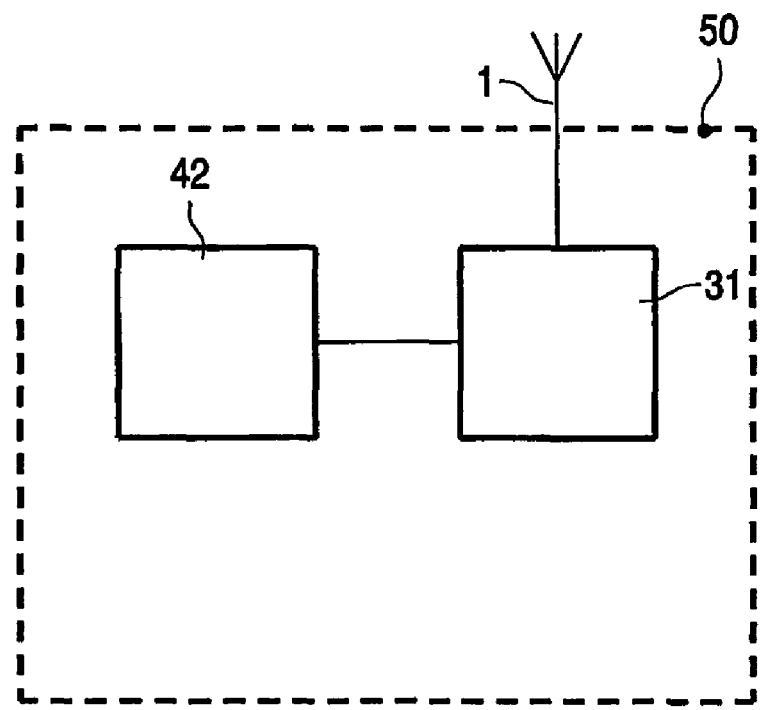
FIG. 5 shows a portable radio device comprising an antenna switch according to the present invention.

FIG. 5 shows a portable radio device, such as a mobile phone, a personal digital assistant or a wireless interface card for (mobile) computers. Shown is an antenna 1, coupled to antenna switch 31. The portable radio device comprises a radio frequency front end 42 for the generation or the processing of the transmitted and received radio frequency signals respectively.

It is to be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. Antenna switch which is arranged to alternately operate in a receive mode and a transmit mode, the antenna switch comprising:
    an adaptive filter for coupling a signal processing means to an antenna during the receive mode and for electrically insulating the signal processing means from the antenna during the transmit mode, wherein the adaptive filter comprises a circuit arrangement of at least one capacitor and at least one inductor, wherein:
        a group of circuit components of the circuit arrangement implements a transmit filter stage with a first passband during the transmit mode, wherein the first passband is a band-pass passband, wherein the
        a high-pass filter coupled between the antenna and switches for the signal processing means; and
    a series arrangement of an inductor, a capacitor, and an inductor switch that are coupled in parallel with the high-pass filter; and
        a subset of the group of circuit components of the circuit arrangement implements a receive filter stage with a second passband during the receive mode, wherein the subset of the group of circuit components of the receive filter stage comprises the high-pass filter coupled between the antenna and switches for the signal processing means.

2. Antenna switch according to claim 1, wherein the signal processing means are electrically insulated from the antenna by controllably configuring the adaptive filter such that the adaptive filter is coupled between the antenna and ground during the transmit mode.

3. Antenna switch according to claim 2, wherein the adaptive filter comprises a high-impedance filter during the transmit mode and a low-impedance filter during the receive mode.

4. Antenna switch according to claim 1, wherein the second passband comprises a high-pass passband.

5. Antenna switch according to claim 1, wherein the adaptive filter comprises a switch device through which the signal processing means is coupled to the adaptive filter.

6. Antenna switch according to claim 5, wherein the switch device comprises a low-power switch device.

7. Antenna switch according to claim 6, wherein the low-power switch device comprises a low-power pHEMT or a MEMS.

8. Antenna switch according to claim 1, wherein the adaptive filter is further arranged to provide electrostatic discharge protection.

9. Antenna switch according to claim 1, wherein the adaptive filter comprises switching devices to change the geometry of the adaptive filter.

10. Module comprising an antenna switch according to claim 1.

11. Portable radio device comprising an antenna switch according to claim 1.

12. The antenna switch according to claim 1, wherein the adaptive filter further comprises:
- a transmitter switch coupled between a transmitter and the antenna; and
- a ground switch coupled between ground and a common node of the series arrangement of the inductor and the third capacitor.

13. The antenna switch according to claim 1, wherein the high-pass filter of the receive filter stage comprises:
- a pair of capacitors coupled in series between the antenna and the signal processing means; and
- another inductor coupled between ground and a common node of the pair of capacitors.

14. The antenna switch according to claim 1, wherein the adaptive filter further comprises:
- a receiver switch coupled between the signal processing means and the subset of the group of circuit components of the receive filter stage, so that the subset of the group of circuit components of the receive filter stage is between the receiver switch and the antenna.

\* \* \* \* \*

UNITED STATES PATENT AND TRADEMARK OFFICE
CERTIFICATE OF CORRECTION

PATENT NO. : 7,885,614 B2  
APPLICATION NO. : 10/565150  
DATED : February 8, 2011  
INVENTOR(S) : Pieter Willem Jedeloo Page 1 of 1

It is certified that error appears in the above-identified patent and that said Letters Patent is hereby corrected as shown below:

In column 4, line 28 (claim 1), delete "wherein the" and insert --wherein the group of circuit components of the transmit filter stage comprises:--.

Signed and Sealed this
Twenty-sixth Day of February, 2013

Teresa Stanek Rea
*Acting Director of the United States Patent and Trademark Office*